US012765277B2

(12) United States Patent
Kang et al.

(10) Patent No.: US 12,765,277 B2
(45) Date of Patent: Oct. 13, 2026

(54) LINEAR RESISTIVE ELEMENT AND PREPARATION METHOD

(71) Applicant: XIAMEN INDUSTRIAL TECHNOLOGY RESEARCH INSTITUTE CO., LTD., Xiamen (CN)

(72) Inventors: Szu-Chun Kang, Xiamen (CN); Tingying Shen, Xiamen (CN); Lijun Shan, Xiamen (CN); Taiwei Chiu, Xiamen (CN); Yu Liu, Xiamen (CN); Yajun Zhang, Xiamen (CN)

(73) Assignee: XIAMEN INDUSTRIAL TECHNOLOGY RESEARCH INSTITUTE CO., LTD., Xiamen (CN)

( * ) Notice: Subject to any disclaimer, the term of this patent is extended or adjusted under 35 U.S.C. 154(b) by 329 days.

(21) Appl. No.: 18/426,367

(22) Filed: Jan. 30, 2024

(65) Prior Publication Data

US 2024/0251686 A1 Jul. 25, 2024

Related U.S. Application Data

(63) Continuation of application No. PCT/CN2022/105406, filed on Jul. 13, 2022.

(30) Foreign Application Priority Data

Nov. 22, 2021 (CN) ......................... 202111386648.3

(51) Int. Cl.
*H10N 70/00* (2023.01)
*H10N 70/20* (2023.01)

(52) U.S. Cl.
CPC ......... *H10N 70/823* (2023.02); *H10N 70/011* (2023.02); *H10N 70/24* (2023.02)

(58) Field of Classification Search
CPC ............................ H10N 70/24; H10N 70/245
See application file for complete search history.

(56) References Cited

U.S. PATENT DOCUMENTS 8,854,873 B1 * 10/2014 Hollmer ............ G11C 13/0069
365/163
8,902,039 B2 12/2014 Suzuki et al.
(Continued)

FOREIGN PATENT DOCUMENTS

CN 110931634 A 3/2020
CN 113285020 A 8/2021
CN 114220914 A 3/2022

OTHER PUBLICATIONS

Internation Search Report of PCT/CN2022/105406, Mailed Aug. 26, 2022.

*Primary Examiner* — Evren Seven

(57) ABSTRACT

Disclosed in embodiments of the present application are a linear resistive element and a preparation method therefor. The linear resistive element includes a substrate unit, a function unit and an electrode unit. The substrate unit includes a substrate layer, which is configured to connect the function unit and the electrode unit. The electrode unit includes a first electrode and a second electrode. The first and second electrodes are deposited on the substrate layer, and the function unit is connected between the first and second electrodes. The function unit includes first dielectric layers and resistive layers. The first dielectric layers and the resistive layers are deposited on the substrate layer in an alternately stacked manner. A number of the resistive layers is at least two, and a conductive filament for conductively connecting the first and second electrodes is formed in each of the resistive layers.

12 Claims, 6 Drawing Sheets

(56) References Cited

U.S. PATENT DOCUMENTS

| | | | | |
|---|---|---|---|---|
| 9,007,167 | B2 | 4/2015 | Takenaka et al. | |
| 10,700,131 | B2 | 6/2020 | Bertin et al. | |
| 2003/0156452 | A1* | 8/2003 | Gilton | G11C 17/14 257/E45.002 |
| 2006/0022347 | A1* | 2/2006 | Campbell | H10N 70/245 257/762 |
| 2007/0284610 | A1* | 12/2007 | Kawaura | H10B 99/10 257/E21.388 |
| 2008/0253167 | A1* | 10/2008 | Symanczyk | H10N 70/8416 438/584 |
| 2009/0159558 | A1* | 6/2009 | Cholet | H10N 70/063 216/13 |
| 2010/0006813 | A1* | 1/2010 | Xi | H10N 70/8825 257/E47.001 |
| 2011/0024715 | A1* | 2/2011 | Jo | B82Y 10/00 977/890 |
| 2012/0292584 | A1 | 11/2012 | Rocklein et al. | |
| 2012/0319072 | A1* | 12/2012 | Wei | H10N 70/8833 257/E47.001 |
| 2013/0153850 | A1* | 6/2013 | Yabuhara | H10N 70/801 257/3 |
| 2013/0328009 | A1* | 12/2013 | Miyagawa | H10N 70/881 257/4 |

* cited by examiner

LINEAR RESISTIVE ELEMENT AND PREPARATION METHOD

CROSS-REFERENCE TO RELATED APPLICATIONS

This application is a continuation of International Patent Application No. PCT/CN2022/105406 filed on Jul. 13, 2022, which is based upon and claims priority to Chinese Patent Application No. 202111386648.3 filed on Nov. 22, 2021, the entire contents of which are incorporated herein by reference.

TECHNICAL FIELD

The present application relates to the technical field of semiconductor devices, and in particular to a linear resistive element and a method for preparing the same.

BACKGROUND

A resistive element is an element that can provide a change in resistance. Changes in the resistance value of a material are often utilized for data storage in the related art. The existing resistive element often includes one conductive filament generated between two electrodes. However, one single conductive filament has poor linear resistive characteristics, making it difficult to use in application environments such as linear weights of neural networks and the like.

SUMMARY

Embodiments of the present application disclose a linear resistive element and a method for preparing the same, in which a plurality of conductive filaments can be generated between two electrodes.

In an aspect, an embodiment of the present application provides a linear resistive element, including a substrate unit, a function unit and an electrode unit. The substrate unit includes a substrate layer. The substrate layer is configured to connect the function unit and the electrode unit. The electrode unit includes a first electrode and a second electrode. The first electrode and the second electrode are deposited on the substrate layer, and the function unit is connected between the first electrode and the second electrode. The function unit includes first dielectric layers and resistive layers. The first dielectric layers and the resistive layers are deposited on the substrate layer in an alternately stacked manner. A number of the resistive layers is at least two, and a conductive filament for conductively connecting the first electrode and the second electrode is formed in each of the resistive layers.

In an implementation, when the resistive layer has a first thickness, a conductive filament having a second thickness may be formed in the resistive layer. The second thickness may correspond to the first thickness. The conductive filament may be an atom-sized conductive filament.

In an implementation, the substrate layer may be provided with a via, the via may be filled with a conductive member, and the conductive member may be electrically connected with the second electrode.

In an implementation, the function unit may further be connected with a second dielectric layer. A wire may penetrate through the second dielectric layer, and the wire may be electrically connected with the first electrode.

In an implementation, the first electrode and the second electrode may be vertically arranged on the substrate layer.

In an implementation, the first electrode and the second electrode may be symmetrically arranged on two sides of the function unit.

In an implementation, a number of the electrode units connected on the substrate layer may be plural.

In an implementation, the resistive layer may be made of a resistive material.

In an implementation, the first dielectric layer may be an insulating layer. The insulating layer may be made of an insulating material. The second dielectric layer may be a dielectric material layer.

In another aspect, an embodiment of the present application provides a method for preparing a linear resistive element, including: providing a via in a substrate layer, and filling the via with a conductive member; alternately depositing first dielectric layers and resistive layers on the substrate layer to form a function unit, a number of the resistive layers being at least two; depositing a first electrode and a second electrode on the substrate layer, the function unit being connected between the first electrode and the second electrode, the second electrode being further connected with the conductive member by means of contact; depositing a second dielectric layer on the function unit, and providing a wire in the second dielectric layer, the wire being electrically connected with the first electrode; and applying a voltage to the first electrode and the second electrode through the conductive member and the wire such that a conductive filament connecting the first electrode and the second electrode is formed in each of the resistive layers in the function unit.

The embodiments of the present application provide the linear resistive element. The function unit containing multiple resistive layers is arranged in the linear resistive element. By forming the conductive filament in each resistive layer, the plurality of conductive filaments can be present between the two electrodes, so that the linear resistive element has linear resistive characteristics and can be applied to multiple application environments.

BRIEF DESCRIPTION OF THE DRAWINGS

The above and other objects, features and advantages of exemplary implementations of the present application will be easily understood by reading the following detailed description with reference to the drawings. In the drawings, several implementations of the present application are shown in an exemplary and not limiting manner.

In the drawings, identical or corresponding reference numerals indicate identical or corresponding parts.

Figure 1:
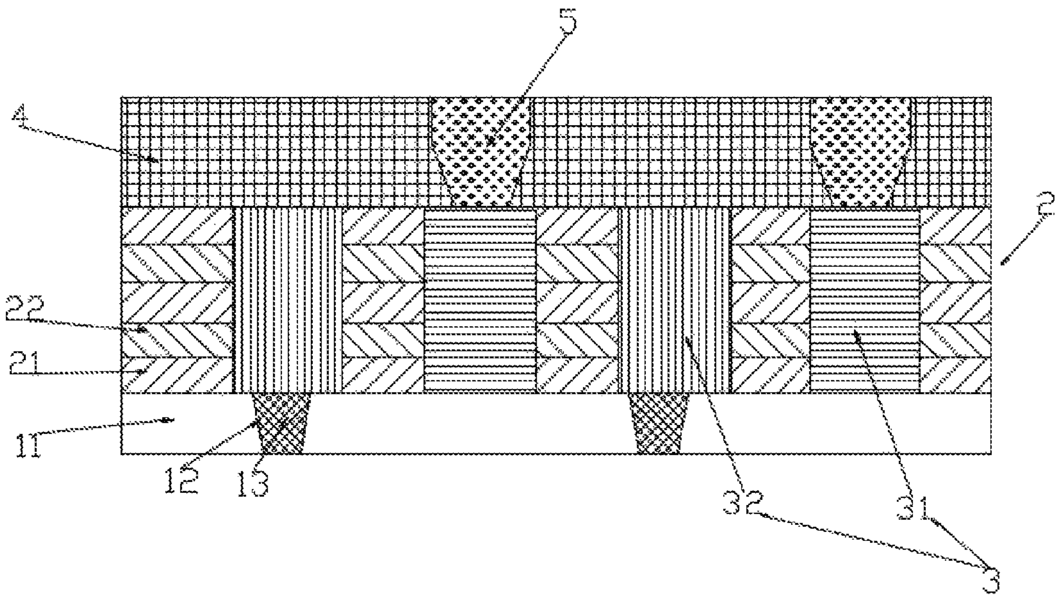
FIG. 1 is a structure diagram of a linear resistive element according to an embodiment of the present application.

The reference numerals are shown as follows:

1 substrate unit; 11 substrate layer; 12 via; 13 conductive member; 2 function unit; 21 first dielectric layer; 22, resistive layer; 23 conductive filament; 3 electrode unit; 31 first electrode; 32 second electrode; 4 second dielectric layer; 41 hard mask; 42 photoresist; 5 wire.

DETAILED DESCRIPTION

In order to make the objectives, features and advantages of the present application more obvious and understandable, the technical solutions in embodiments of the present application will be described clearly and completely in conjunction with the drawings in embodiments of the present application. It is apparent that the described embodiments are only a part, but not all of the embodiments of the present application. All other embodiments obtained by those skilled in the art based on the embodiments of the present application without creative efforts shall fall within the protection scope of the present application.

Figure 2:
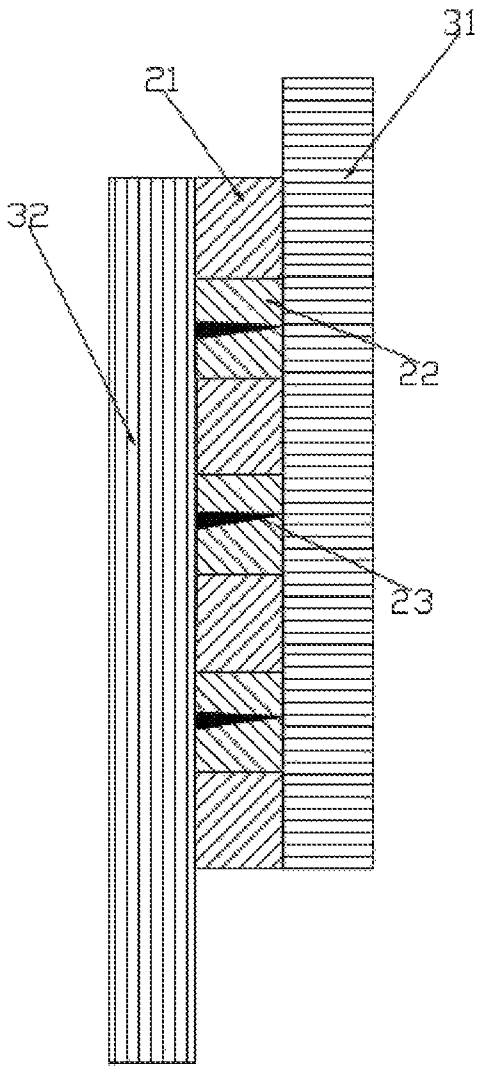
FIG. 2 is a schematic diagram showing connection of a function unit and an electrode unit of a linear resistive element according to an embodiment of the present application.

FIG. 1 is a structure diagram of a linear resistive element according to an embodiment of the present application. FIG. 2 is a schematic diagram showing connection of a function unit and an electrode unit of a linear resistive element according to an embodiment of the present application. Reference can be made to FIG. 1 and FIG. 2.

In an aspect, an embodiment of the present application provides a linear resistive element (also called linear resistance variation element), including a substrate unit 1, a function unit 2 and an electrode unit 3. The substrate unit 1 includes a substrate layer 11. The substrate layer 11 is configured to connect the function unit 2 and the electrode unit 3. The electrode unit 3 includes a first electrode 31 and a second electrode 32. The first electrode 31 and the second electrode 32 are deposited on the substrate layer 11, and the function unit 2 is connected between the first electrode 31 and the second electrode 32. The function unit 2 includes first dielectric layers 21 and resistive layers (also called resistance variation layers) 22. The first dielectric layers 21 and the resistive layers 22 are deposited on the substrate layer 11 in an alternately stacked manner. A number of the resistive layers 22 is at least two, and a conductive filament 23 for conductively connecting the first electrode 31 and the second electrode 32 is formed in each of the resistive layers 22.

The embodiment of the present application provides the linear resistive element. The function unit 2 containing multiple resistive layers 22 is arranged in the linear resistive element. By forming the conductive filament 23 in each resistive layer 22, the plurality of conductive filaments 23 can be present between the two electrodes, so that the linear resistive element has linear resistive characteristics and can be applied to multiple application environments.

In the embodiment, the substrate unit is configured to connect the function unit 2 and the electrode unit 3. The substrate unit at least includes the substrate layer 11. The substrate layer 11 is made of a substrate material. The electrode unit 3 includes the first electrode 31 and the second electrode 32. For the first electrode 31 and the second electrode 32, which one is positive or negative is not limited here. The function unit 2 is connected between the first electrode 31 and the second electrode 32. Typically, the first electrode and the second electrode located on two sides of one function unit 2 are respectively the positive electrode and the negative electrode. The function unit 2 is mainly formed by the first dielectric layers 21 and the resistive layers 22, and specifically, mainly formed by alternately stacking the plurality of first dielectric layers 21 and the plurality of resistive layers 22, and the sequence of the stacking may be: the first dielectric layer 21, the resistive layer 22, the first dielectric layer 21, the resistive layer 22, the first dielectric layer 21, . . . , which are stacked sequentially. The number of the resistive layers 22 is at least two, but not limited thereto. Because of the presence of the plurality of resistive layers 22, after a voltage is applied, the conductive filament 23 is formed in each resistive layer 22, so that the number of the conductive filaments 23 can be controlled by controlling the number of the resistive layers 22. Further, since the plurality of conductive filaments 23 are formed in the function unit 2, the linear resistive element has linear resistive characteristics, so that the linear resistive element can realize linear weights required by neural networks. The first dielectric layer 21 is an insulating layer. The insulating layer is made of an insulating material. Specifically, the insulating material may be silicon dioxide or aluminum oxide, so as to ensure no conductive filament 23 generated in the first dielectric layer 21. The resistive layer 22 is configured to generate the conductive filament 23 under the action of the voltage. The resistive layer 22 is made of a material that can easily form a conductive filament relative to the dielectric layer. The resistive layer is mainly made of a resistive material. The resistive material refers to a material with a resistive function. Specifically, the resistive layer may be made of transition metal oxides, which at least include hafnium dioxide, titanium dioxide and tantalum pentoxide. The resistive layer 22 is configured to conductively connect the first electrode 31 and the second electrode 32. Specifically, the conductive filament 23 in the resistive layer 22 is configured to conductively connect the first electrode 31 and the second electrode 32. The first electrode 31 and the second electrode 32 are vertically deposited on the substrate layer 11, that is, the first electrode 31 and the second electrode 32 are perpendicular to the contact surface of the substrate layer 11 so as to facilitate the connection between the electrodes and the resistive layer 22. In addition, since the electrodes are arranged vertically, the plurality of resistive layers 22 are arranged between the two vertical electrodes, so that the plurality of conductive filaments 23 can be realized with the area of one resistive layer 22, thereby reducing the area of the linear resistive element. Moreover, since the electrodes are arranged vertically, there is no need to make the size of the electrode correspond to that of the resistive layer 22, and the operator can miniaturize the resistive layer 22 so as to reduce the voltage formed by the conductive filament 23. Further, the first electrode 31 and the second electrode 32 may be symmetrically arranged on two sides of the function unit 2 so as to facilitate the formation of the conductive filaments 23.

In an implementation, when the resistive layer 22 has a first thickness, a conductive filament 23 having a second thickness is formed in the resistive layer 22. The second thickness corresponds to the first thickness. The conductive filament 23 is an atom-sized conductive filament 23.

In the embodiment, when the resistive layer 22 has the first thickness, the conductive filament 23 with the second thickness is formed in the resistive layer 22. The second thickness corresponds to the first thickness. The first thickness is preset by the staff. By adjusting the thickness of the resistive layer 22, the size of the conductive filament 23 can be controlled, so that the conductance of the conductive filament 23, i.e., the degree to which the conductive filament conducts electricity, can be controlled. The conductive filament 23 is typically atom-sized. Therefore, during the process of depositing the resistive layer 22, atomic layer deposition may be adopted, so that the size of the conductive filament 23 can be controlled easily. Further, by alternately stacking the resistive layers 22 and the first dielectric layers 21 between the first electrode 31 and the second electrode 32 that are arranged vertically, the position where the conductive filament 23 is formed can be controlled accurately.

In an embodiment, the substrate layer 11 is provided with a via 12, the via 12 is filled with a conductive member 13, and the conductive member 13 is electrically connected with the second electrode 32.

In the embodiment, the shape of the via 12 provided in the substrate layer 11 is not limited, and the via 12 may be filled with the conductive member 13 made of a conductive material, which may be used as a lower terminal of the linear resistive element to be electrically connected with the second electrode 32. Specifically, the conductive material may be titanium nitride or tungsten. A number of the vias 12 is the same as that of the second electrodes 32 so as to cooperate with the second electrodes 32.

In an embodiment, the function unit 2 is further connected with a second dielectric layer 4. A wire 5 penetrates through the second dielectric layer 4, and the wire 5 is electrically connected with the first electrode 31.

In the embodiment, the function unit 2 is further connected with the second dielectric layer 4. The second dielectric layer 4 may be arranged on the function unit 2. The second dielectric layer 4 is mainly made of a dielectric material. Specifically, the second dielectric layer 4 may be an ultralow dielectric constant dielectric material layer mainly made of an ultralow dielectric constant material (ULK). The metal wire 5 penetrates through the second dielectric layer 4. The metal wire 5 may be made of a copper material or other conductive materials. The connection of the metal wire 5 may be realized by dual damascene. The wire 5 is configured to be electrically connected with the first electrode 31.

In an embodiment, a number of the electrode units 3 connected on the substrate layer 11 may be plural. When the number of the electrode units 3 is plural, the number of the function units 2 is the same as that of the electrode units 3.

In the embodiment, the numbers of the electrode units 3 and the function units 2 are not limited, and a plurality of linear resistive elements formed by the electrode units 3 and the function units 2 may be integrated on one substrate layer 11. It should be noted that the number of the electrode units 3 is the same as that of the function units 2.

In another aspect, an embodiment of the present application provides a method for preparing a linear resistive element, including: providing a via 12 in a substrate layer 11, and filling the via 12 with a conductive member 13; alternately depositing first dielectric layers 21 and resistive layers 22 on the substrate layer 11 to form a function unit 2, a number of the resistive layers 22 being at least two; depositing a first electrode 31 and a second electrode 32 on the substrate layer 11, the function unit 2 being connected between the first electrode 31 and the second electrode 32, the second electrode 32 being further connected with the conductive member 13 by means of contact; depositing a second dielectric layer 4 on the function unit 2, and providing a wire 5 in the second dielectric layer 4, the wire 5 being electrically connected with the first electrode 31; and applying a voltage to the first electrode 31 and the second electrode 32 through the conductive member 13 and the wire 5 such that a conductive filament 23 connecting the first electrode 31 and the second electrode 32 is formed in each of the resistive layers 22 in the function unit 2.

In the embodiment, after the first dielectric layers 21 and the resistive layers 22 are alternately deposited on the substrate layer 11 to form the function unit 2, the function unit 2 may be etched to form accommodating cavities for containing the first electrode 31 and the second electrode 32, and then the first electrode 31 and the second electrode 32 of the electrode unit may be deposited on the substrate layer 11 according to the positions of the accommodating cavities. When the second electrode 32 is deposited on the substrate layer 11, the second electrode 32 is electrically connected with the conductive member 13, and specifically, may be electrically connected with the conductive member by means of contact. The second dielectric layer 4 is deposited on the function unit 2 and the electrode unit 3, and the second dielectric layer 4 is provided with the wire 5 electrically connected with the first electrode 31. The voltage is applied to the first electrode 31 and the second electrode 32 through the conductive member 13 and the wire 5, so that the conductive filament 23 connecting the first electrode 31 and the second electrode 32 is formed in each of the resistive layers 22 in the function unit 2.

A specific embodiment is provided.

Figure 3:
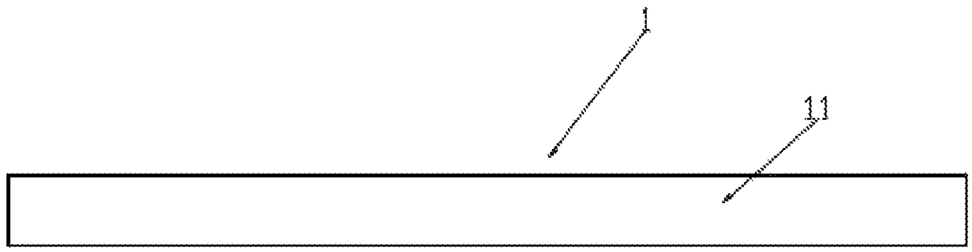
FIG. 3 is a schematic diagram of a substrate layer in a method for preparing a linear resistive element according to an embodiment of the present application.

Step 1: a substrate layer 11 is obtained. The substrate layer is shown in FIG. 3. A substrate unit 1 includes the substrate layer 11.

Figure 4:
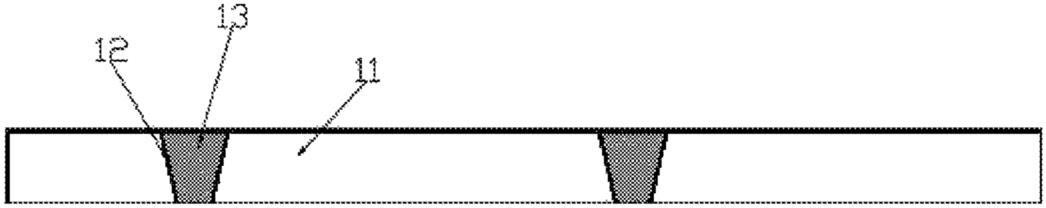
FIG. 4 is a schematic diagram of a via in a method for preparing a linear resistive element according to an embodiment of the present application.

Step 2: as shown in FIG. 4, a via 12 is provided in the substrate layer 11, and the via 12 is filled with a conductive member 13 made of a conductive material (titanium nitride or tungsten), which is used as a lower terminal of a linear resistive element.

Figure 5:
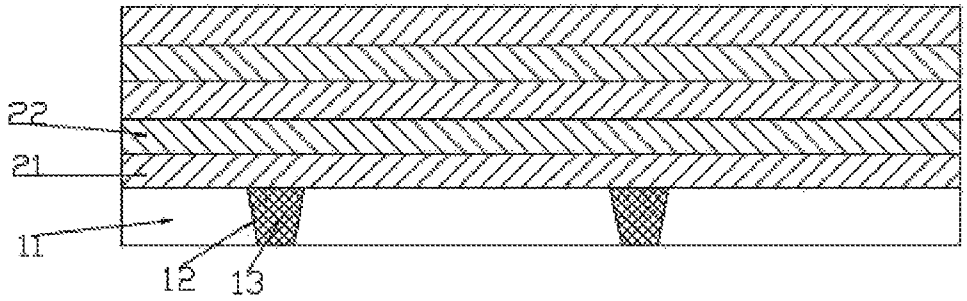
FIG. 5 is a schematic diagram showing deposition of a function unit in a method for preparing a linear resistive element according to an embodiment of the present application.

Step 3: as shown in FIG. 5, first dielectric layers 21 and resistive layers 22 are alternately deposited on the substrate layer 11 in the sequence of "first dielectric layer 21-resistive layer 22-first dielectric layer 21-resistive layer 22-first dielectric layer 21" to form a function unit 2.

Figure 6:
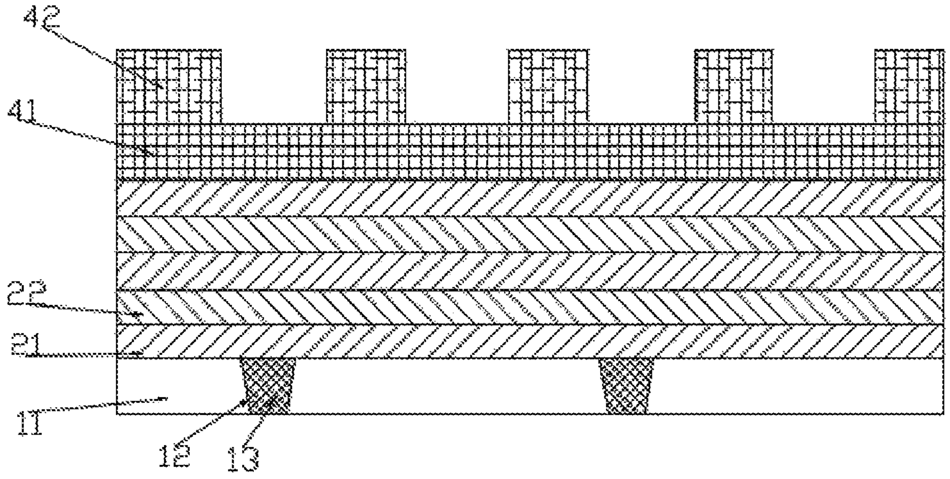
FIG. 6 is a schematic diagram showing deposition of a photoresist and a hard mask in a method for preparing a linear resistive element according to an embodiment of the present application.

Step 4: as shown in FIG. 6, a hard mask 41 is deposited on the function unit 2. The hard mask 41 may be made of a material with a selective ratio relative to the dielectric layer and the resistive layer 22 to facilitate etching of the function unit 2. Specifically, a silicon nitride material may be used. Then, a photoresist 42 is coated on the hard mask 41, and the photoresist 42 is exposed.

Figure 7:
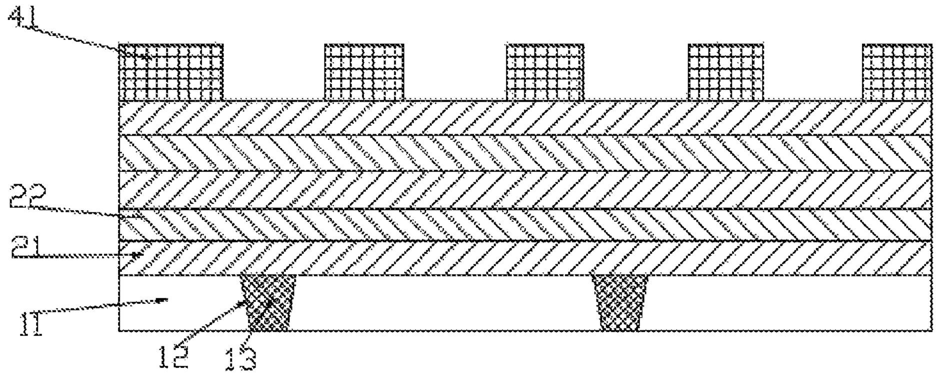
FIG. 7 is a schematic diagram showing etching of a hard mask in a method for preparing a linear resistive element according to an embodiment of the present application.

Step 5: as shown in FIG. 7, the hard mask 41 is etched, and the size of the hard mask 41 is reduced by miniaturization to reduce the voltage required for forming a conductive filament 23.

Figure 8:
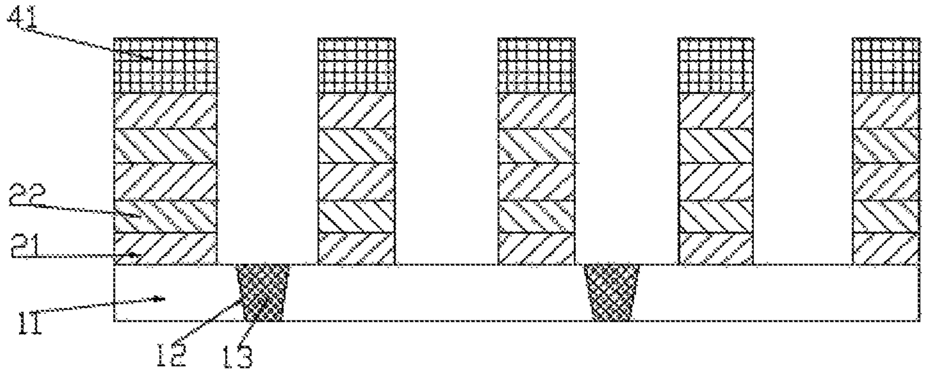
FIG. 8 is a schematic diagram showing etching of a function unit in a method for preparing a linear resistive element according to an embodiment of the present application.

Step 6: as shown in FIG. 8, the first dielectric layers 21 and the resistive layers 22 are etched, and the etched first dielectric layers 21 and resistive layers 22 are further miniaturized to reduce the size of the element, thereby reducing the voltage for forming the conductive filament 23. In this case, after the first dielectric layers 21 and the resistive layers 22 are etched, accommodating grooves/cavities for containing a first electrode 31 and a second electrode 32 are obtained. Since the area of the conductive filament 23 is quite small relative to the electrode, it is often impossible to miniaturize the element due to the size of the electrode in the traditional process.

Figure 9:
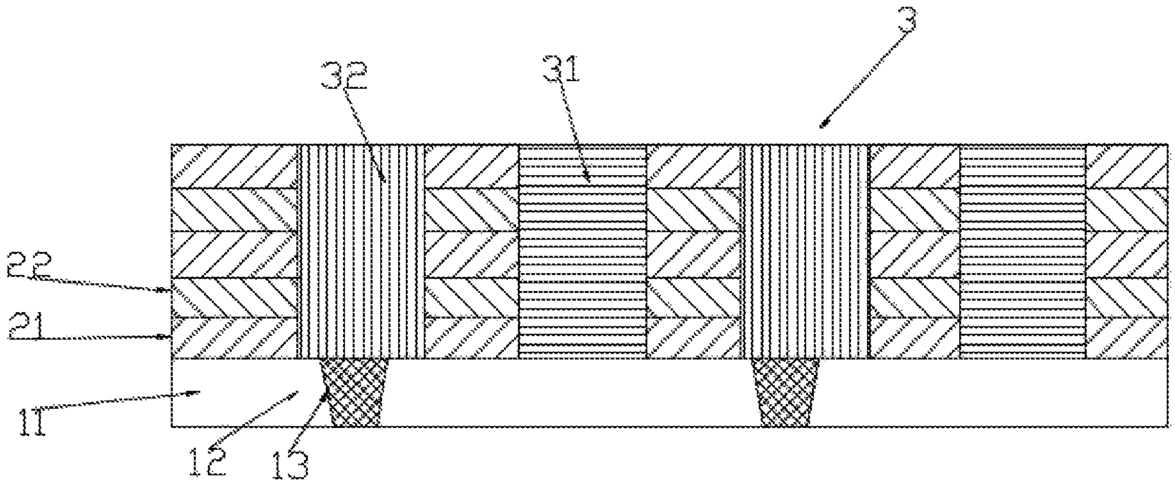
FIG. 9 is a schematic diagram showing chemical mechanical polishing in a method for preparing a linear resistive element according to an embodiment of the present application.

Step 7: as shown in FIG. 9, the first electrode 31 and the second electrode 32 are deposited on the substrate layer 11 according to the positions of the accommodating grooves, and the second electrode 32 is connected with the conductive member 13. An upper surface of the element is flattened by chemical mechanical polishing.

Step 8: as shown in FIG. 1, the first electrode 31 is connected with a metal wire 5, and a second dielectric layer 4 is deposited on the upper surface formed by the first electrode 31, the second electrode 32 and the function unit 2. The second dielectric layer 4 is made of a dielectric material, preferably an ultralow dielectric constant material (ULK). The metal wire 5 may be made of copper or other conductive materials, and may be connected by dual damascene or other metal wiring technologies.

In the description of this specification, descriptions referring to the terms "an embodiment", "some embodiments", "example", "specific example" or "some examples" mean that specific features, structures, materials or characteristics described in conjunction with the embodiment or example are included in at least one embodiment or example of the present application. Furthermore, the specific features, structures, materials or characteristics described may be combined in a suitable manner in any one or more embodiments or examples. In addition, in a case of no conflict, various embodiments or examples described in this specification, as well as features of various embodiments or examples, may be combined and coupled by those skilled in the art.

In addition, the terms "first" and "second" are only used for descriptive purposes, and cannot be understood as indicating or implying relative importance or implicitly indicating the number of technical features indicated. Thus, the features defined with "first" and "second" may explicitly or implicitly include at least one such feature. In the description of the present application, "a plurality of" means two or more than two, unless otherwise specifically defined.

The above is merely specific implementations of the present application, but the protection scope of the present application is not limited thereto. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. A linear resistive element, comprising a substrate unit (1), a function unit (2) and an electrode unit (3); wherein the substrate unit (1) comprises a substrate layer (11); the substrate layer (11) is configured to connect the function unit (2) and the electrode unit (3);

the electrode unit (3) comprises a first electrode (31) and a second electrode (32), the first electrode (31) and the second electrode (32) are deposited on the substrate layer (11), and the function unit (2) is connected between the first electrode (31) and the second electrode (32); and the function unit (2) comprises first dielectric layers (21) and resistive layers (22), the first dielectric layers (21) and the resistive layers (22) are deposited on the substrate layer (11) in an alternately stacked manner, a number of the resistive layers (22) is at least two, and each of the resistive layers (22) is configured to form a conductive filament (23) for conductively connecting the first electrode (31) and the second electrode (32) upon application of a voltage to the electrode unit (3);

wherein the first electrode (31) and the second electrode (32) are vertically arranged on the substrate layer (11), and the resistive layers (22) and the first dielectric layers (21) are alternately stacked between the first electrode (31) and the second electrode (32) that are arranged vertically.

2. The linear resistive element of claim 1, wherein when the resistive layer (22) has a first thickness, a conductive filament (23) having a second thickness is formed in the resistive layer (22), and the conductive filament (23) is an atom-sized conductive filament (23).

3. The linear resistive element of claim 1, wherein the substrate layer (11) is provided with a via (12), the via (12) is filled with a conductive member (13), and the conductive member (13) is electrically connected with the second electrode (32).

4. The linear resistive element of claim 1, wherein the function unit (2) is further connected with a second dielectric layer (4), a wire (5) penetrates through the second dielectric layer (4), and the wire (5) is electrically connected with the first electrode (31).

5. The linear resistive element of claim 1, wherein the first electrode (31) and the second electrode (32) are symmetrically arranged on two sides of the function unit (2).

6. The linear resistive element of claim 1, wherein a number of the electrode units (3) connected on the substrate layer (11) is plural.

7. The linear resistive element of claim 1, wherein the resistive layer (22) is made of a resistive material.

8. The linear resistive element of claim 4, wherein the first dielectric layer (21) is an insulating layer, the insulating layer is made of an insulating material; and the second dielectric layer (4) is a dielectric material layer.

9. A method for preparing a linear resistive element, comprising:

providing a via (12) in a substrate layer (11), and filling the via (12) with a conductive member (13);

alternately depositing first dielectric layers (21) and resistive layers (22) on the substrate layer (11) to form a function unit (2), a number of the resistive layers (22) being at least two;

depositing a first electrode (31) and a second electrode (32) on the substrate layer (11), the function unit (2) being connected between the first electrode (31) and the second electrode (32), the second electrode (32) being further connected with the conductive member (13) by means of contact;

depositing a second dielectric layer (4) on the function unit (2), and providing a wire (5) in the second dielectric layer (4), the wire (5) being electrically connected with the first electrode (31); and applying a voltage to the first electrode (31) and the second electrode (32) through the conductive member (13) and the wire (5) such that a conductive filament (23) connecting the first electrode (31) and the second electrode (32) is formed in each of the resistive layers (22) in the function unit (2);

wherein the first electrode (31) and the second electrode (32) are vertically arranged on the substrate layer (11), and the resistive layers (22) and the first dielectric layers (21) are alternately stacked between the first electrode (31) and the second electrode (32) that are arranged vertically.

10. The linear resistive element of claim 1, wherein the function unit (2) is formed by alternately stacking a plurality of first dielectric layers (21) and a plurality of resistive layers (22), and a sequence of the stacking includes: the first dielectric layer (21), the resistive layer (22), the first dielectric layer (21), the resistive layer (22), the first dielectric layer (21) which are stacked sequentially.

11. The linear resistive element of claim 2, wherein the first thickness is preset, and the first thickness of the resistive layer (22) is adjusted to control a size of the conductive filament (23).

12. The linear resistive element of claim 6, wherein when the number of the electrode units (3) is plural, a number of the function units (2) is the same as the number of the electrode units (3).

* * * * *